United States Patent
Kinoshita et al.

(10) Patent No.: US 7,353,481 B2
(45) Date of Patent: Apr. 1, 2008

(54) COMPUTER IMPLEMENTED METHOD FOR DESIGNING A SEMICONDUCTOR INTEGRATED CIRCUIT AND A SEMICONDUCTOR INTEGRATED CIRCUIT

(75) Inventors: Koichi Kinoshita, Yokohama (JP); Yukihiro Urakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 11/320,643

(22) Filed: Dec. 30, 2005

(65) Prior Publication Data

US 2006/0166434 A1 Jul. 27, 2006

(30) Foreign Application Priority Data

Jan. 4, 2005 (JP) ............... 2005-000238

(51) Int. Cl.
*G06F 17/50* (2006.01)
*H01L 25/00* (2006.01)
*H03L 19/00* (2006.01)
*H03H 1/00* (2006.01)
*H03H 2/00* (2006.01)

(52) U.S. Cl. .................. 716/10; 716/13; 716/14; 326/101; 323/364; 438/618; 438/622

(58) Field of Classification Search ............ 716/10, 716/13, 14; 326/101; 323/364; 438/618, 438/622
See application file for complete search history.

(56) References Cited

U.S. PATENT DOCUMENTS

| | | | | |
|---|---|---|---|---|
| 4,956,761 A * | 9/1990 | Higashi | ................. | 363/19 |
| 5,062,079 A * | 10/1991 | Tsuchida et al. | ............ | 365/210 |
| 5,708,356 A * | 1/1998 | Onodera | ................. | 323/275 |
| 6,468,894 B1 | 10/2002 | Yang et al. | | |
| 6,670,665 B2 * | 12/2003 | Beer et al. | ................. | 257/296 |
| 6,954,371 B2 * | 10/2005 | Hokari et al. | ............ | 365/149 |
| 7,145,792 B2 * | 12/2006 | Hokari et al. | ............ | 365/149 |
| 7,271,017 B2 * | 9/2007 | Park | ................. | 438/20 |
| 7,274,074 B2 * | 9/2007 | Koubuchi et al. | ......... | 257/374 |
| 2002/0013931 A1 * | 1/2002 | Cano et al. | ................. | 716/1 |
| 2004/0005758 A1 * | 1/2004 | Chang et al. | ............ | 438/257 |
| 2004/0046213 A1 * | 3/2004 | Hanzawa et al. | .......... | 257/390 |
| 2004/0088669 A1 * | 5/2004 | Loh et al. | ................. | 716/13 |

(Continued)

FOREIGN PATENT DOCUMENTS

JP 02077133 A * 3/1990

(Continued)

OTHER PUBLICATIONS

Automated English Translation of Japanese Patent Publication No. JP-10041398 A, translated on Sep. 12,2007, pp. 1-9.*

*Primary Examiner*—Phallaka Kik
(74) *Attorney, Agent, or Firm*—Oblon, Spivak, McClelland, Maier & Neustadt, P.C.

(57) ABSTRACT

A computer implemented method for designing a semiconductor integrated circuit includes placing dummy pattern on a second interconnection layer positioned just above the first power line based on a placement result of the first power line, the dummy pattern having a long axis parallel with a direction of the first power line; and electrically connecting the dummy pattern to the first power line, based on placement results of the first power line and the dummy pattern.

17 Claims, 14 Drawing Sheets

U.S. PATENT DOCUMENTS

2006/0059449 A1* 3/2006 Yang et al. .................... 716/11
2006/0199284 A1* 9/2006 Yomogita .................... 438/11

FOREIGN PATENT DOCUMENTS

| JP | 02290027 A | * | 11/1990 |
| JP | 10041398 A | * | 2/1998 |
| JP | 2004-153015 | | 5/2004 |

* cited by examiner

COMPUTER IMPLEMENTED METHOD FOR DESIGNING A SEMICONDUCTOR INTEGRATED CIRCUIT AND A SEMICONDUCTOR INTEGRATED CIRCUIT

CROSS REFERENCE TO RELATED APPLICATIONS AND INCORPORATION BY REFERENCE

This application is based upon and claims the benefit of priority from the prior Japanese Patent Applications No. P2005-000238, filed on Jan. 4, 2005; the entire contents of which are incorporated herein by reference.

BACKGROUND OF THE INVENTION

1. Field of the Invention

The present invention relates to a computer implemented method for designing a semiconductor integrated circuit and a semiconductor integrated circuit including a plurality of dummy patterns provided in a multi-level interconnect.

2. Description of the Related Art

Along with the miniaturization of semiconductor integrated circuits, a low dielectric constant film having a lower dielectric constant than a silicon oxide film ($SiO_2$) has been adopted as an interlayer dielectric in a semiconductor integrated circuit. Recently, a practical use of a porous low dielectric constant film (porous-low-k film) having microscopic pores in a dielectric has been tried.

It has been found that the semiconductor integrated circuit including interlayer dielectric formed of the porous low k dielectric has poor mechanical and adhesion strength. Therefore, cracks and peeling between dielectrics may occur due to mechanical stresses during fabrication processes, such as chemical mechanical polish (CMP).

It is also known that the mechanical strength of the dielectric is decreased when the relative dielectric constant of the dielectric is decreased. Therefore, formulation of the semiconductor integrated circuit having a mechanical strength strong enough to endure mechanical stresses during fabrication has been needed in addition to the development of new materials of low k dielectrics.

To reinforce the mechanical strength of semiconductor integrated circuit, a semiconductor integrated circuit having a plurality of dummy patterns provided in part of an interconnection layers is known. However, when too many dummy patterns are inserted in one part of the interconnection layers, pattern density will be increased. Accordingly, the semiconductor integrated circuit having dummy patterns may fail to work due to crosstalk noise between adjoining patterns. Therefore, further miniaturization and integration of the semiconductor integrated circuit will become difficult.

SUMMARY OF THE INVENTION

An aspect of the present invention inheres in an computer implemented method for designing a semiconductor integrated circuit encompassing placing a first power line on a first interconnection layer; placing a dummy pattern on a second interconnection layer positioned just above the first power line based on a placement result of the first power line, the dummy pattern having a long axis parallel with a direction of the first power line; and electrically connecting the dummy pattern to the first power line, based on placement results of the first power line and the dummy pattern.

Another aspect of the present invention inheres in a semiconductor integrated circuit encompassing a semiconductor substrate; a first power line provided on the semiconductor substrate; a first insulator dielectric having a relative dielectric constant equal to or lower than silicon oxide provided on the first power line; a dummy line embedded in the first insulator dielectric and extending parallel to a direction of the first power line; and a plurality of first dummy vias embedded in the first insulator dielectric and connected to the first power line and the dummy line.

Still another aspect of the present invention inheres in a semiconductor integrated circuit having multi-level interconnects, encompassing a plurality of first power lines provided on a semiconductor substrate; a first insulator dielectric having a relative dielectric constant equal to or lower than silicon oxide provided on the first power lines; and a plurality of dummy lines embedded in the first insulator dielectric above one of the first power lines, in an area corresponding to a planar area where density of signal lines in the multi-level interconnects is low, each of the dummy lines having a long axis parallel to a direction of the first power line.

BRIEF DESCRIPTION OF DRAWINGS

FIG. 21A illustrates a layout example before dummy patterns are placed. FIG. 21B illustrates a layout example after the dummy patterns are placed.

DETAILED DESCRIPTION OF THE INVENTION

Figure 1:
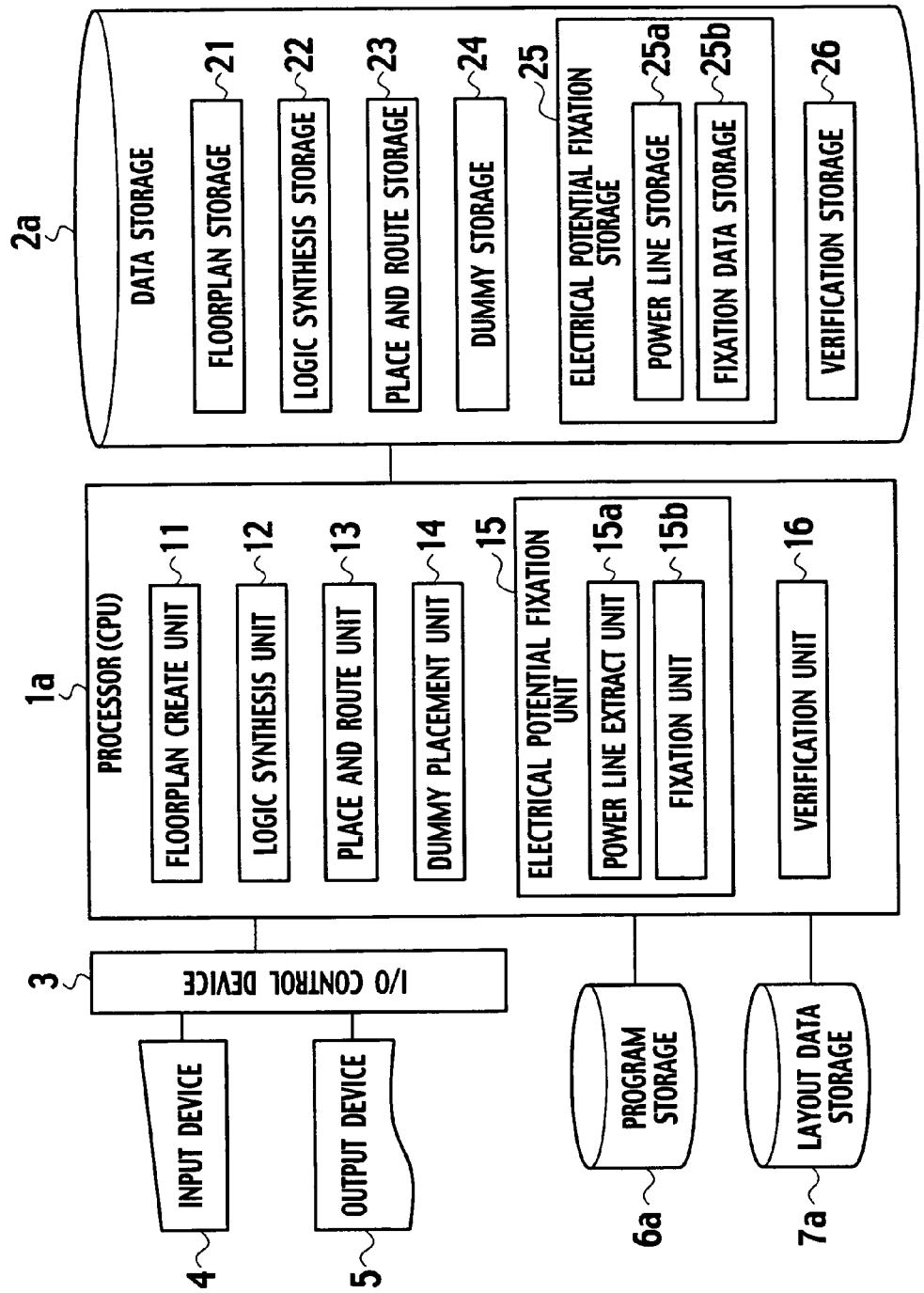
FIG. 1 is a block diagram illustrating an automated design system according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. However, it will be obvious to those skilled in the art that the present invention may be practiced without such specific details.

First Embodiment

As shown in FIG. 1, an automated design system according to the first embodiment of the present invention includes an input device 4, a processor (CPU) 1a, a data storage 2a, an output device 5, a program storage 6a, and a layout data storage 7a. The input device 4 permits input of data, instructions and the like from an operator. The CPU 1a processes several operations such as layout designing of a semiconductor integrated circuit and the like. The data storage 2a stores processed data of CPU 1a. The output device 5 outputs layout results and the like. The program storage 6a stores a layout program of the semiconductor integrated circuit, predetermined data such as design rules, and design limitation rules, which are necessary for designing a semiconductor integrated circuit. The input device 4 and the output device 5 are connected to the CPU 1a through an I/O control device 3.

The CPU 1a includes a floorplan create unit 11, a logic synthesis unit 12, a place and route unit 13, a dummy placement unit 14, an electrical potential fixation unit 15, and a verification unit 16. The floorplan create unit 11 creates a floorplan based on circuit data and design limitation data of an LSI and a block size of the circuit data. The logic synthesis unit 12 synthesizes a logic circuit based on the circuit data and the floorplan. The place and route unit 13 automatically places and routes circuit elements such as macro cells, power lines, signal lines, and the like on a chip area.

Figure 2:
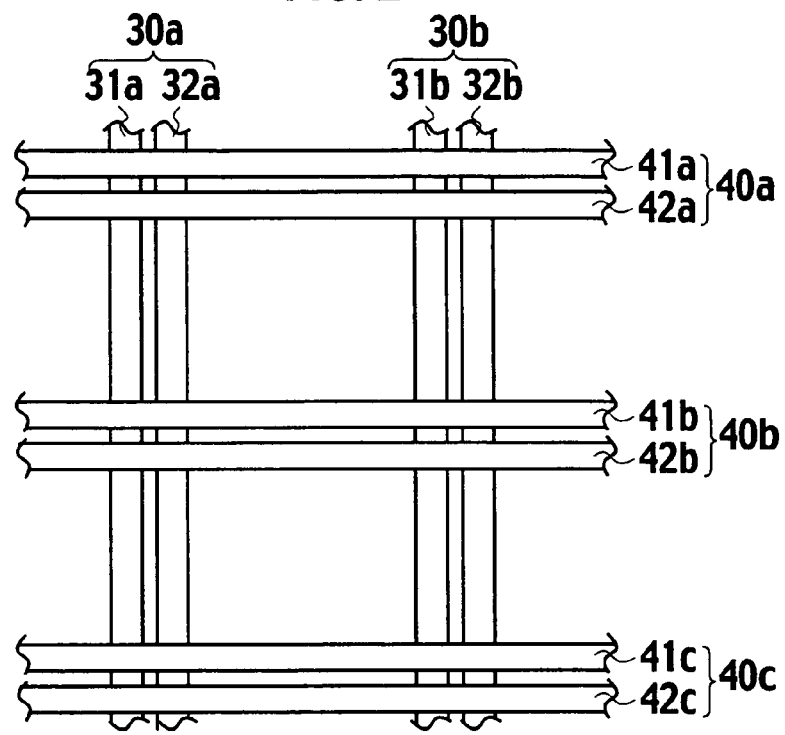
FIGS. 2 to 4 are plan views illustrating layout examples of an interconnection layer designed by the automated design system according to the first embodiment of the present invention.

FIG. 2 shows a layout example illustrating power lines placed by the place and route unit 13. The power lines 30a, 30b, 40a, 40b, and 40c are arranged in two interconnection layers and extend in two different directions (vertical and horizontal) respectively. Referring to FIG. 2, first power lines 30a and 30 are arranged in parallel with each other on a first interconnection layer. Second power lines 40a, 40b, and 40c are arranged in parallel with each other on a second interconnection layer on the lower interconnection layer. The second power lines 40a, 40b, and 40c extend perpendicular to the first power lines 30a and 30b.

The first power line 30a includes a first high voltage power line 31a and a first low voltage power line 32a positioned adjacent the first high voltage power line 31a. The first power line 30b includes a first high voltage power line 31b and a first low voltage power line 32b positioned adjacent the first high voltage power line 31b. The second power line 40a includes a second high voltage power line 41a and a second low voltage power line 42a positioned adjacent the second high voltage power line 41a. The second power line 40b includes a second high voltage power line 41b and a second low voltage power line 42b positioned adjacent the second high voltage power line 41b. The second power line 40c includes a second high voltage power line 41c and a second low voltage power line 42c positioned adjacent the second high voltage power line 41c.

Figure 3:
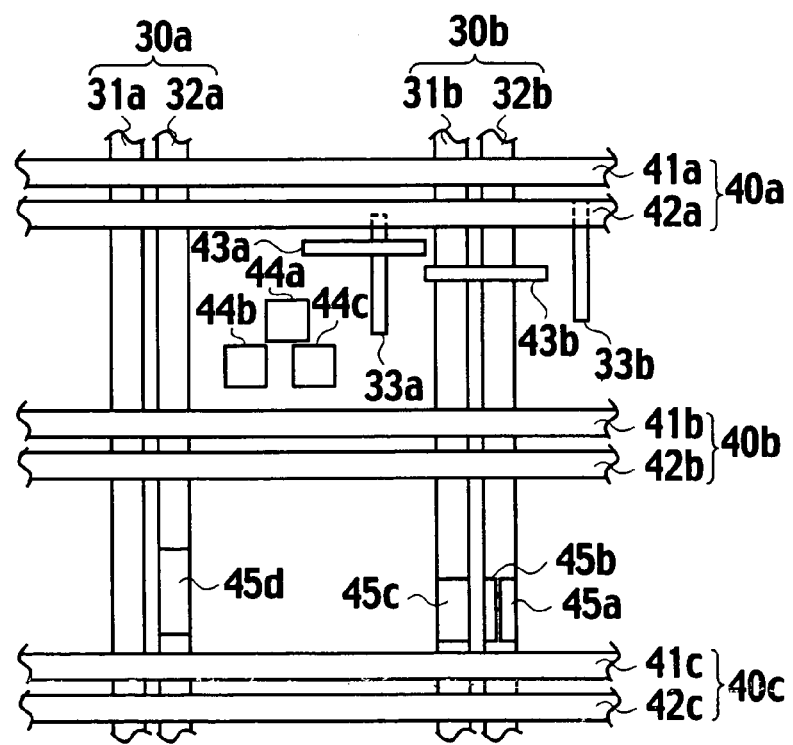

The dummy placement unit 14 automatically places a plurality of dummy patterns in an area with sparse patterns in the multi-level interconnections. The area with sparse patterns indicates an area having a coverage less than a predetermined range stored in the layout data storage 7a. Suitably, as shown in FIG. 3, the dummy placement unit 14 places a plurality of dummy patterns 45a, 45b, 45c, and 45d on the upper interconnection layer which is positioned just above the first power lines 30a and 30b in preference to a plurality of signal lines (not shown in FIG. 3). The dummy patterns 45a, 45b, 45c, and 45d have a long axis oriented in a drawing direction of the first power lines 30a and 30b. As a pattern having a long axis oriented in a drawing direction of the first power lines 30a and 30b is that a pattern having a strip-shaped such as a rectangle pattern, a quadrate pattern, and an oval pattern is suitable.

The dummy placement unit 14 can also place rectangular dummy patterns 33a and 33b on the same interconnection layer as the first power lines 30a and 30b. The dummy patterns 33a and 33b have a long axis in a drawing direction of the first power lines 30a and 30b. The dummy placement unit 14 can also place rectangular dummy patterns 43a, 43b, 44a, 44b, 44c on the same interconnection layer as the second power lines 40a, 40b, and 40c.

The electrical potential fixation unit 15 includes a power line extract subunit 15a and a fixation subunit 15b. The power line extract subunit 15a extracts location data of power lines provided in each of the multi-level interconnections. The fixation subunit 15b fixes the dummy patterns to the power lines so that the dummy patterns have the same electrical potential as the power lines by connecting dummy vias between the dummy patterns and the power lines, when the dummy patterns are provided on upper or lower layer of the power lines.

Figure 4:
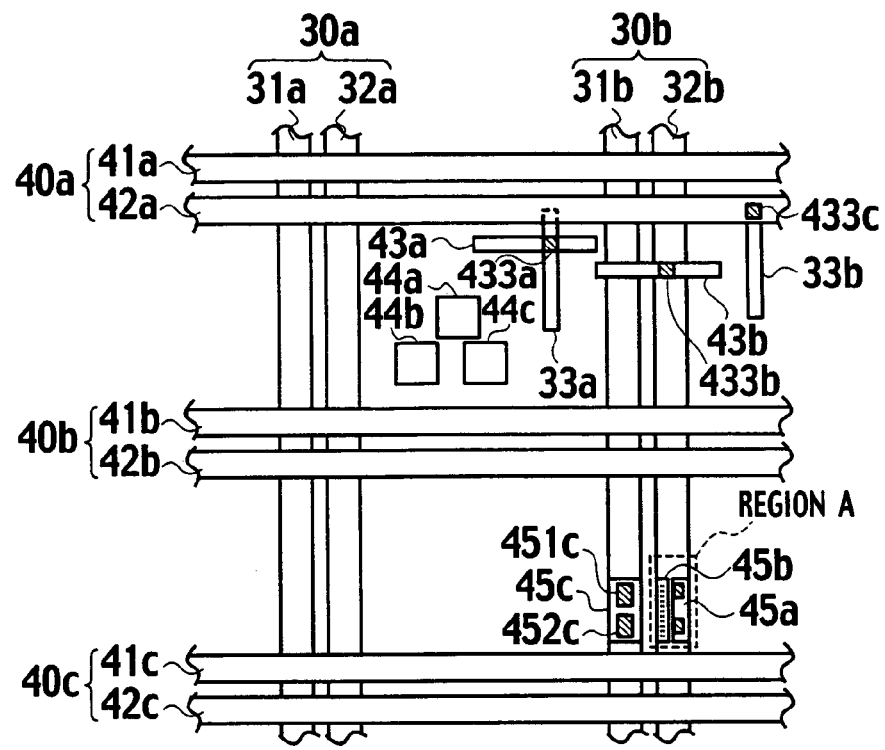

As shown in FIG. 4, a dummy pattern 45c is positioned just above the layer of the first high voltage power line 31b. The electrical potential fixation unit 15 fixes the dummy pattern 45c to the first high voltage power line 31b by use of the dummy vias 451c and 452d, so that the dummy pattern 45c has the same electrical potential as the first high voltage power line 31b. The electrical potential fixation unit 15 also fixes the dummy pattern 33b to the second low voltage power line 42a so that the dummy pattern 33b has the same electrical potential as the second low voltage power line 42a by use of a dummy via 433c.

The electrical potential fixation unit 15 fixes a dummy pattern 43b to the first low voltage power line 32b so that the dummy pattern 43b has the same electrical potential as the first low voltage power line 32b by use of a dummy via 433b. In addition, the electrical potential fixation unit 15 can also fix the dummy pattern 33a on the lower layer to the dummy pattern 43a on the upper layer by use of a dummy via 433a.

Figure 5:
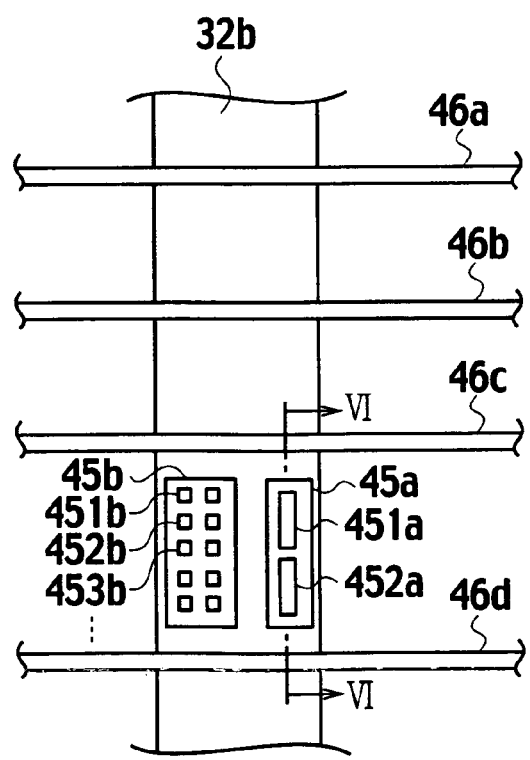
FIG. 5 is an enlarged view illustrating a part of the interconnection layer of FIG. 4.
Figure 6:
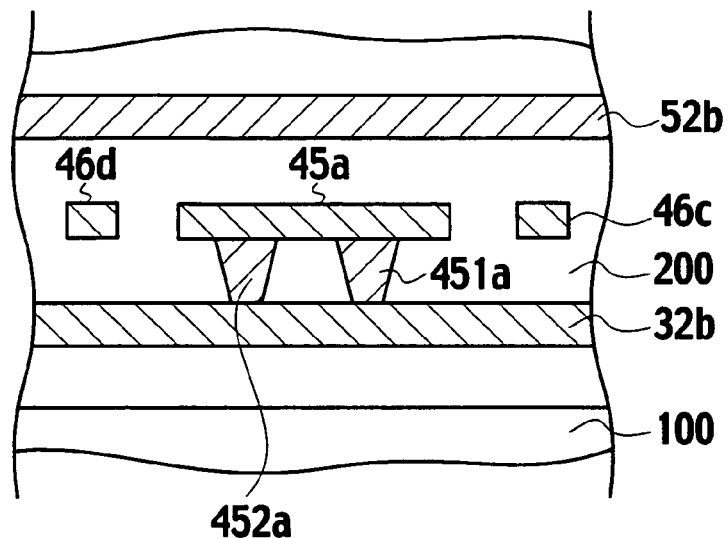
FIGS. 6 and 7 are cross-sectional views illustrating layout examples taken on line VI-VI in FIG. 5, designed by the automated design system according to the first embodiment of the present invention.

FIG. 5 shows an enlarged view of a "region A" in FIG. 4. Signal lines 46a, 46b, 46c, and 46d is provided on the upper layer of the first low voltage power line 32b. Each of the signal lines 46a, 46b, 46c, and 46d extends perpendicular to a drawing direction of the first low voltage power line 32b. Each line width of the signal lines 46a, 46b, 46c, and 46d are smaller than the first low voltage power line 32b. For example, the line widths of the signal lines 46a, 46b, 46c, and 46d can be provided in a range of about 1/20 to about 1/30 of the line width of the first low voltage power line 32b. The power line extract subunit 15a extracts data of the first low voltage power line 32b. Based on the extracted data, the fixation subunit 15b fixes the dummy pattern 45a to the first low voltage power line 32b, which is arranged just above the layer of the dummy pattern 45a, by use of the rectangle dummy vias 451a and 452a. The dummy vias 451a and 452a have a long axis in a drawing direction of the dummy pattern 45a. As a result, as shown in FIG. 6, a "metallic wall" composed of the dummy pattern 45a, the dummy vias 451a and 451b, and the first low voltage power line 32b is constructed in an insulator dielectric 200.

Figure 7:
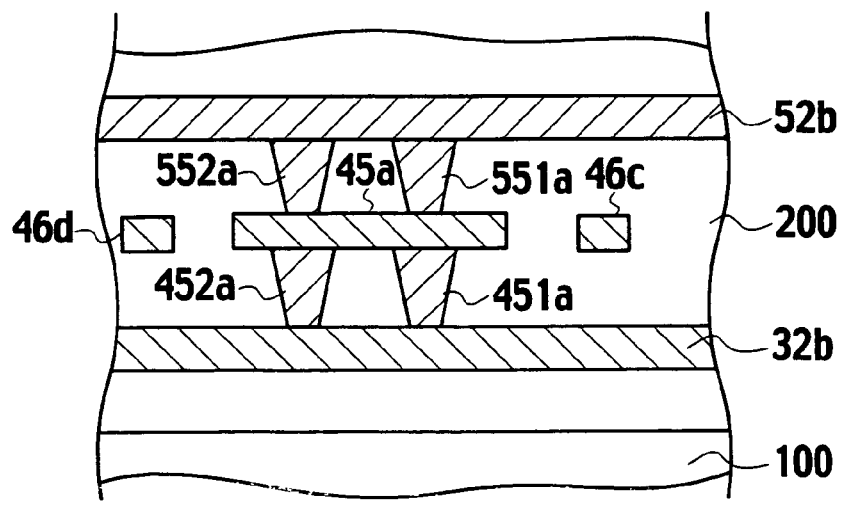

As shown in FIG. 7, there is a third low voltage power line 52b extending in the same direction as the first low voltage power line 32b on the upper layer of the first low voltage power line 32b. The third low voltage power line 52b can be electrically connected to the first low voltage power line 32b without problems in operation. The fixation subunit 15b fixes the third low voltage power line 52b to the first low voltage power line 32b through the dummy pattern 45 by use of dummy vias 551a and 552a. The dummy vias 551a and 552a have long and narrow shapes and extending direction of the first low voltage power line 32b. For example, a rectangle pattern and an oval pattern may be suitable as the dummy vias 551a and 552a.

The number of the dummy vias 451a, 452a, 551a and 552a is not limited. For example, as shown in FIG. 5, the first low voltage power line 32b and the dummy pattern 45b can be connected by a plurality of rectangle-shaped vias 451b, 452b, 453b, . . . , which are provided and spaced equally to the plane of the dummy pattern 45b.

The verification unit 16 provides a timing verification of the semiconductor integrated circuit based on the placement result of lines in the multi-level interconnect layers by the place and route unit 13 and the placement result of dummy patterns by the dummy placement unit 14. For example, the verification unit 16 verifies static timing analysis (STA) and the like. The verification unit 16 may verify power supply noise, crosstalk verification, circuit verification and the like.

The data storage 2a includes a floorplan storage 21, a logic synthesis unit 22, a place and route storage 23, a dummy storage 24, an electrical potential fixation storage 25, and a verification storage 26. The floorplan storage 21 stores the floorplan created by the floorplan create unit 11. The logic synthesis unit 22 stores data of logic synthesis synthesized by the logic synthesis unit 12. The place and route storage 23 stores the placement result of lines in the multi-level interconnections executed by the place and route unit 13. The dummy storage 24 stores the placement result of dummy patterns placed by the dummy placement unit 14.

The electrical potential fixation storage 25 includes a power line storage 25a and a fixation data storage 25b. The power line storage 25a stores location data of power lines extracted by the power line extract subunit 15a. The fixation data storage 25b stores fixation data of dummy patterns and power lines fixed by the fixation unit 15b. The verification storage 26 stores the verification result of timing verified by the verification unit 16.

The input device 4 includes a keyboard, a mouse, a light pen, a flexible disk, and the like. The operator can input design data through the input device 4. It is also possible to input installation of layout parameters, calculations, cancellations or the like. The display device 5 displays input and output data, layout results and the like. The output device 5 includes a display, a printer, and recording equipment, which record data to a computer readable recording media. The computer readable recording media includes memory storage such as a semiconductor memory, a magnetic disk, a laser disk, a cassette tape, and open reel and the like.

Next, a description will be given of a computer implemented method for designing a semiconductor integrated circuit according to the first embodiment with reference to cross-sectional views of FIGS. 2 to 7, and a flowchart of FIG. 8.

Figure 8:
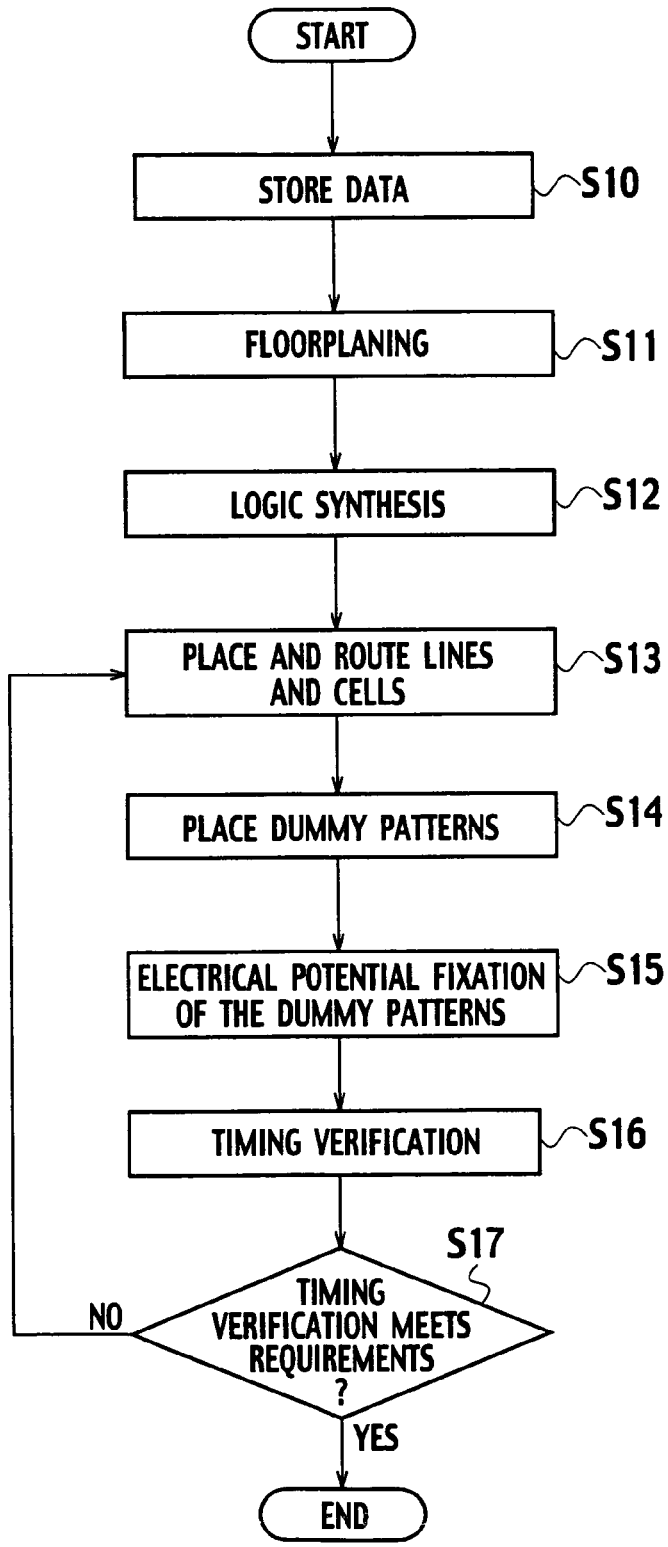
FIG. 8 is a flowchart illustrating a method of designing a semiconductor integrated circuit according to the first embodiment of the present invention.

In a step S10 in FIG. 8, data necessary for a design of the semiconductor integrated circuit is transmitted from the input device 4 to the layout data storage 7a through the I/O control device 3. The layout data storage 7a stores basic circuit data, design limitation data, design rules to place and route power lines and signal lines on the chip area, and placement limitation data to place the dummy patterns, giving a priority to placement of the power lines.

In a step S11, the floorplan create unit 11 creates a floorplan based on circuit data, design limitation data of LSI, and a block size of the circuit data and the like. The created floorplan is stored in the floorplan storage 21. The floorplan may be created by the operator and inputted through the input device 4 to the floorplan storage 21. In a step S12, the logic synthesis unit 12 synthesizes a logic synthesis based on the floorplan stored in the floorplan storage 21 and layout data stored in the layout data storage 7a. The logic synthesis result is stored in the logic synthesis unit 22.

In a step S13, as shown in FIG. 3, the place and route unit 13 places circuit elements such as macro cells, and routes the power lines 30a, 30b, 40a, 40b, and 40c and signal lines (not shown) based on the data of the logic synthesis result stored in the logic synthesis unit 22 and layout data stored in the layout data storage 7a. The result of the placement and routing data is stored in the place and route storage 23. In addition, the place and route unit 13 can limit the amount of the signal lines just above the layer of the power lines 30a, 30b, 40a, 40b, and 40c, so that the dummy placement unit 14 can preferentially place the dummy patterns based on the design limitation data stored in the layout data storage.

In a step S14, the dummy placement unit 14 places the dummy patterns 33a, 33b, 43a, 43b, 44a, 44b, 44c, 45a, 45b, 45c, and 45d to the area with sparse patterns in the multi-level interconnections. As shown in FIG. 4, the dummy placement unit 14 can place the dummy patterns 45a, 45b, 45c, and 45d on the same layer as the second power lines 40a, 40b, and 40c. The dummy patterns 45a, 45b, 45c, and 45d are positioned just above the first low voltage power line 32b on a plane and have a longitudinal direction horizontal to the extending direction of the first low voltage power line 32b. The placement results of the dummy patterns 33a to 45a are stored in the dummy storage 24.

In a step S15, the electrical potential fixation unit 15 reads the placement result of the lines and dummy patterns placed in the interconnection layers from the place and route storage 23 and the dummy storage 24 respectively. As shown in FIG. 5, the power line extract subunit 15a extracts the first low voltage power line 32b in the interconnection layers and stores the data of the first low voltage power line 32b in the power line storage 25a. The fixation subunit 15b reads data of the first low voltage power line 32b stored the data in the power line storage 25a, and judges or determines whether or not the dummy patterns 45a and 45b are positioned on the upper or lower layer of the first low voltage power line 32b. If there are dummy patterns 45a and 45b, the fixation subunit 15b fixes the first low voltage power line 32b to the dummy patterns 45a and 45b so that the dummy patterns 45a and 45b have the same electrical potential as the first low voltage power line 32b by connecting the dummy vias 451a, 451b, 452b, 453b . . . .

In a step S16, the verification unit 16 reads fixation data of the electrical potentials of the interconnection layers stored in the fixation data storage 25b. The verification unit 16 verifies timings circuit timing of the interconnection layers based on the timing verification information stored in the layout data storage 7a. The result of timing verification is stored in the verification storage 26.

In a step S17, the verification unit 16 reads layout data stored in the layout data storage 7a. The verification unit 16 verifies whether or not the timing verification result stored in the verification storage 26 meets the preliminary timing verification limitation parameters stored in the layout data storage 7a. If the timing verification result does not meet the timing verification limitation parameters, in the step S13, the place and route unit 13 places and routes lines and cells on the chip again. If the timing verification result meets the timing verification limitation parameters, the layout designing is completed.

With the automated design system according to the first embodiment of the present invention, the dummy placement unit 14 places the dummy patterns 33a to 45d in the area with sparse patterns in the multi-level interconnections. Therefore, metal layers are uniformly provided in the multi-level interconnection S. Accordingly, a semiconductor device with strong resistance to stresses added by fabricating processes such as CMP can be designed.

In addition, as shown in FIG. 4, floating patterns such as the dummy pattern 44a, 44b, and 44c, which are not connected to other patterns or lines, are easily affected by the crosstalk noise generated by adjacent signal lines. In the first embodiment of the present invention, as shown in FIG. 5, the electrical potential fixation unit 15 fixes the dummy patterns 45a and 45b to the first low voltage power line 32b with the dummy vias 451a, 452a, 451b, 452b, 453b, . . . . As a result, since the dummy patterns 45a and 45b are fixed to have the same electrical potential as the first low voltage power line 32b, crosstalk noise between adjoining signal lines can be shielded by the dummy patterns 45a and 45b.

Moreover, since the dummy patterns 45a and 45b are fixed to the first low voltage power line 32b, having a specific electrical potential and having larger line width than the dummy patterns 45a and 45b, it becomes easy to fix the electrical potential and calculate the amount of capacitance and resistance compared to the case where the dummy patterns 45a and 45b are fixed to the signal lines, which have smaller line width and which have unspecified electrical potentials. Accordingly, it becomes easy to verify the timing verification by the verification unit 16.

Furthermore, since the dummy placement unit 14 places the dummy patterns 45a and 45b having a long axis in the drawing direction of the first low voltage power line 32b, many dummy vias 451a to 453b can be placed between the first low voltage power line 32b and the dummy patterns 45a and 45b. Accordingly, as shown in FIG. 6, the "metallic wall", which is composed of the first low voltage power line 32b and dummy vias 451a and 452a can be formed in the insulator dielectric 200. Consequently, the mechanical strength of the semiconductor integrated circuit may be reinforced by the metallic wall. Further, as shown in FIG. 5, since the shape of the dummy vias 451a and 451b are formed to have a long axis perpendicular to the drawing direction of the first low voltage power line 32b, mechanical strength can be increased more.

Figure 9:
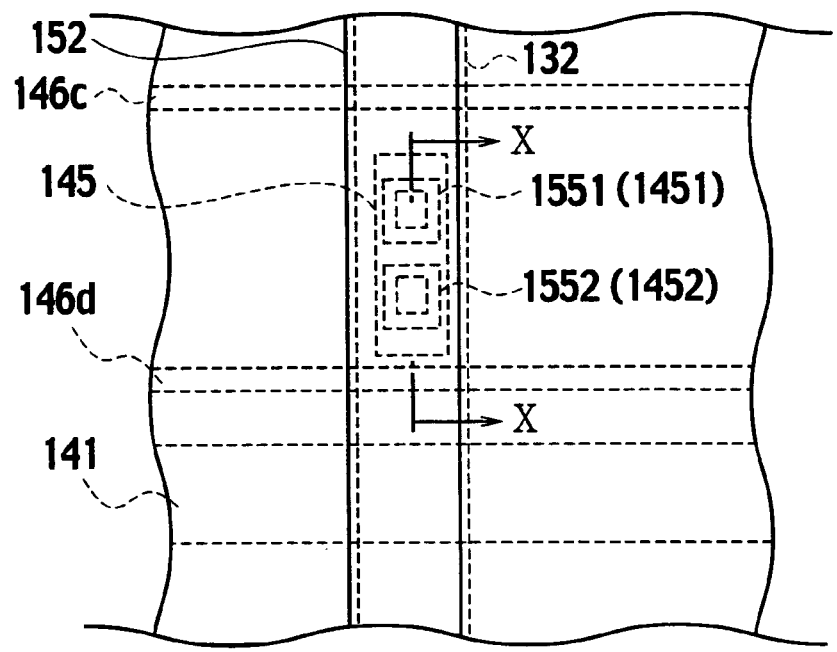
FIG. 9 is a plan view illustrating a semiconductor integrated circuit according to the first embodiment of the present invention.
Figure 10:
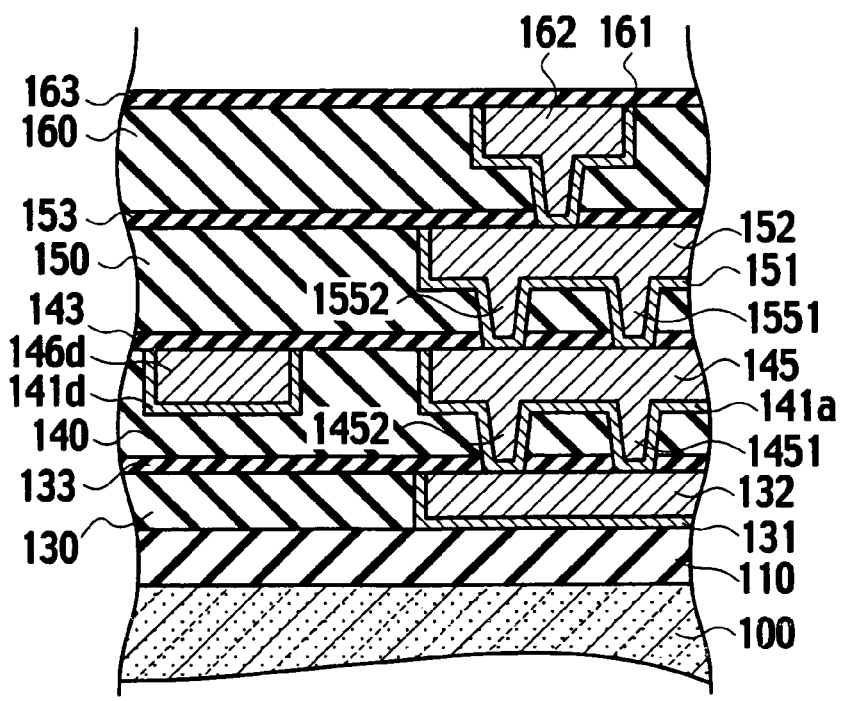
FIGS. 10 to 12 are cross-sectional views illustrating the semiconductor integrated circuit taken on line X-X in FIG. 9, according to the first embodiment of the present invention.

FIGS. 9 and 10 show examples of the semiconductor integrated circuit designed by the automated design system according to the first embodiment of the present invention. The semiconductor integrated circuit includes, a semiconductor substrate 100, a first power line 132 above the semiconductor substrate 100, a low dielectric constant film (third insulator dielectric) 140 on the first power line 132, and a dummy line 145 embedded in the surface of the third insulator dielectric 140, and first dummy vias 1451 and 1452 connected to the first power line 132 and the dummy line 145.

FIG. 9 shows a plan view seen from the top surface of a third power line 152 provided on the upper layer of the dummy line 145. A second power line 141 is provided on the lower layer of the third power line 152. The second power line 141 extends perpendicular to the drawing direction of the third power line 152. Signal lines 146c and 146d are provided on the same layer as the second power line 141. The signal lines 146c and 146d extend in parallel to the drawing direction of the second power line 141. The first power line 132, which extends perpendicular to the drawing direction of the second power line 141 and overlaps with the third power line 152 on the plane, is provided on the lower layer of the second power line 141. The dummy line 145, which has the long axis in the drawing direction of the first power line, is provided on the same layer as the second power line 141 and positioned between the first power line 132 and the third power line 152. The dummy line 145 has a rectangular shape. The dummy line 145 is connected to the first power line 132 through the first dummy vias 1451 and 1452. The dummy line 145 is connected to the third power line 152 through second dummy vias 1551 and 1552.

As shown in FIG. 10, a first insulator dielectric 110 is provided on the semiconductor substrate 100. A second insulator dielectric 130 is provided on the first insulator dielectric 110. The first power line 132 is provided in the second insulator dielectric 130 through a barrier metal 131. A first diffusion barrier film 133 having a relative dielectric constant higher than the second insulator dielectric 130 is provided on the first power line 132 and the first power line 132. The third insulator dielectric 140 is provided on the first diffusion barrier film 133.

The first dummy vias 1451 and 1452 and the first power line 132 are buried in the third insulator dielectric 140 through a barrier metal 141a. A signal line 146d buried in the third insulator dielectric 140 through a barrier metal 141d is spaced from the dummy line 145.

A second diffusion barrier film 143 having a higher relative dielectric constant than the third insulator dielectric 140 is provided on the third insulator dielectric 140, the signal line 146d, and the dummy line 145. A fourth insulator dielectric 150 is provided on the second diffusion barrier film 143. In the fourth insulator dielectric 150, the third power line 152 and the second dummy vias 1551 and 1552 are embedded and connected to the dummy line 145 through a barrier metal 151. A third diffusion barrier film 153 having a higher relative dielectric constant than the fourth insulator dielectric 150 is provided on the third power line 152 and the fourth insulator dielectric 150. A fifth insulator dielectric 160 is provided on the third diffusion barrier film 153. A signal line 162 connected to the third power line 152 through a barrier metal is embedded in the fifth insulator dielectric 160. A fourth diffusion barrier film 163 having a higher relative dielectric constant than the fifth insulator dielectric 160 is provided on the fifth insulator dielectric 160.

A low dielectric constant film having a lower relative dielectric constant than the silicon oxide ($SiO_2$) may be suitable for the material of the first to fifth insulator dielectrics 130, 140, 150, and 160. A low dielectric constant film having a relative dielectric constant of less than 3.0, or less than 2.3, may be more suitable for the first to fifth insulator dielectrics 130, 140, 150, and 160. However, materials of the first to fifth insulator dielectrics 130, 140, 150, and 160 may change depending on the generation of the semiconductor integrated circuit and positions on the semiconductor substrate 100.

The first to fifth insulator dielectrics 130, 140, 150, and 160, materials as a methyl silsesquioxane ((MSQ: $CH_3SiO_{1.5}$) (k=2.7-3.0)), a hydrogen silsesquioxane ((HSQ: H—$SiO_{1.5}$) (k=3.5-3.8), a porous MSQ (k=3.5-3.8), a porous HSQ (k=2.0-2.5), and organic silica ($CH_3$—$SiO_x$) (k=2.5-3.0), a polytetrafluoroethelene (PTFE) (k=2.1), a polyarylether (PAE) (k=2.7-2.9), a porous PAE (k=2.0-2.2), and a benzocycrobthene (BCB) (k=2.6-3.3) can be used.

The first to fourth diffusion barrier film 133, 143, 153, and 163 may be made from insulative materials such as a silicon carbide (SiC), a silicon carbide nitride (SiCN), a silicon nitride (SiN), a carbon doped silicon mono oxide (SiOC), $SiO_2$, and the like.

The barrier metals 131, 141a, 141d, 151, and 161 may be made from titanium (Ti), niobium (Nb), tantalum (Ta), rubidium (Ru), tungsten (W), and compounds such as alloys, nitrides, oxides, and carbides, which are made from at least two materials selected from above described materials.

The first power line 132, the first dummy vias 1451 and 1452, the dummy line 145, the second dummy vias 1551 and 1552, the second power line 141, the third power line 152, and the signal lines 146d and 162 may be made from copper (Cu).

Figure 11:
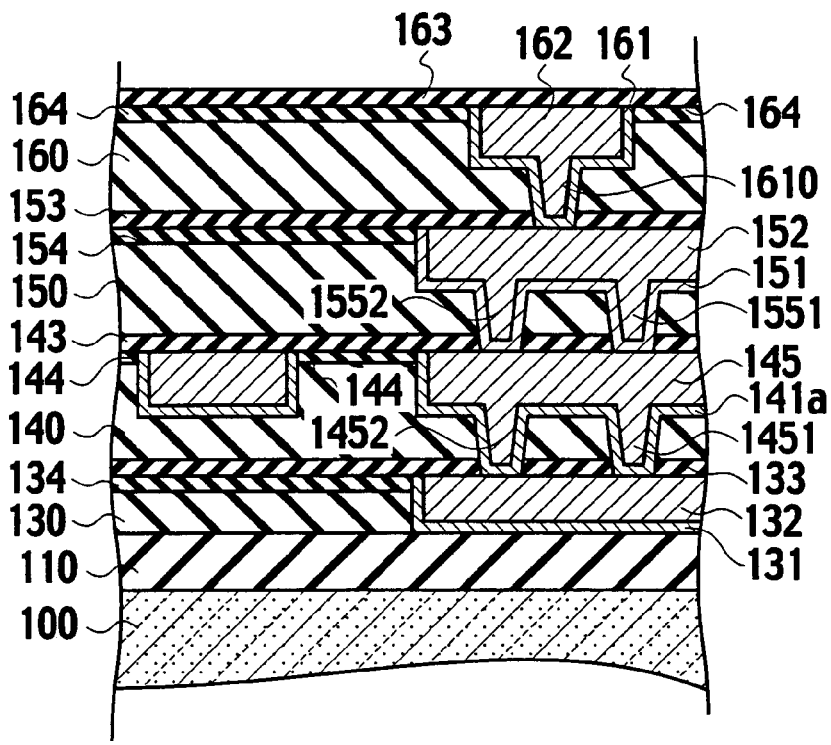

As shown in FIG. 11, the semiconductor integrated circuit according to the first embodiment of the present invention can include etch stop layers 134, 144, 154, and 164. The etch stop layers 134, 144, 154, and 164 are provided on each of the first to fifth insulator dielectrics 130, 140, 150, and 160. The etch stop layers 134, 144, 154, and 164 have a higher relative dielectric constant than the first to fifth insulator dielectrics 130, 140, 150, and 160.

Figure 12:
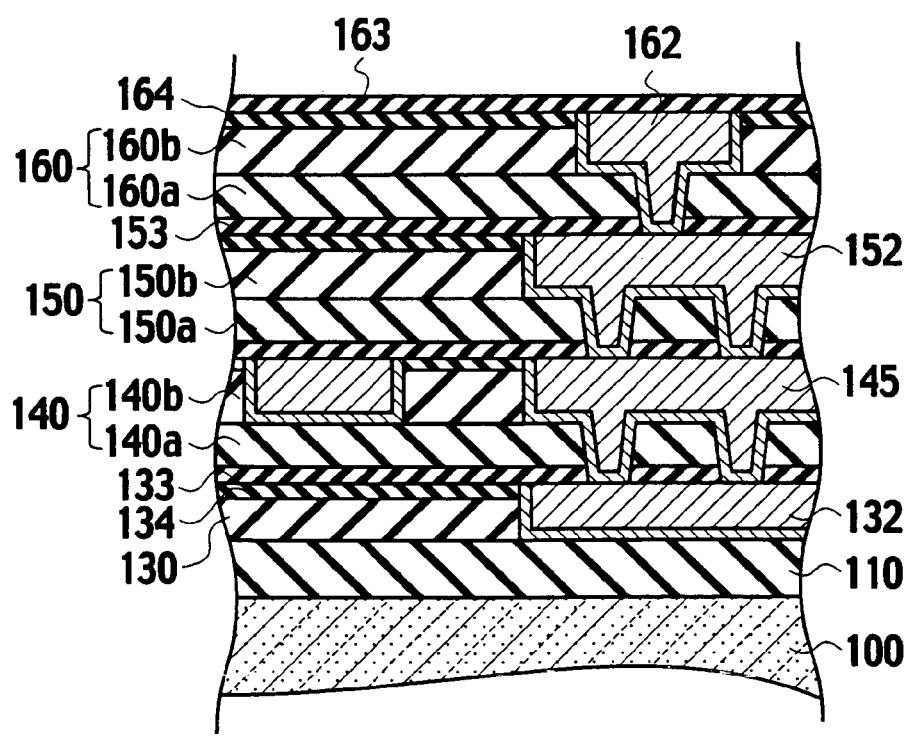

As shown in FIG. 12, each of the first to fifth insulator dielectrics 130, 140, 150, and 160 can includes a plurality of films 140a and 140b, 150a and 150b, and 160a and 160b.

Figure 13:
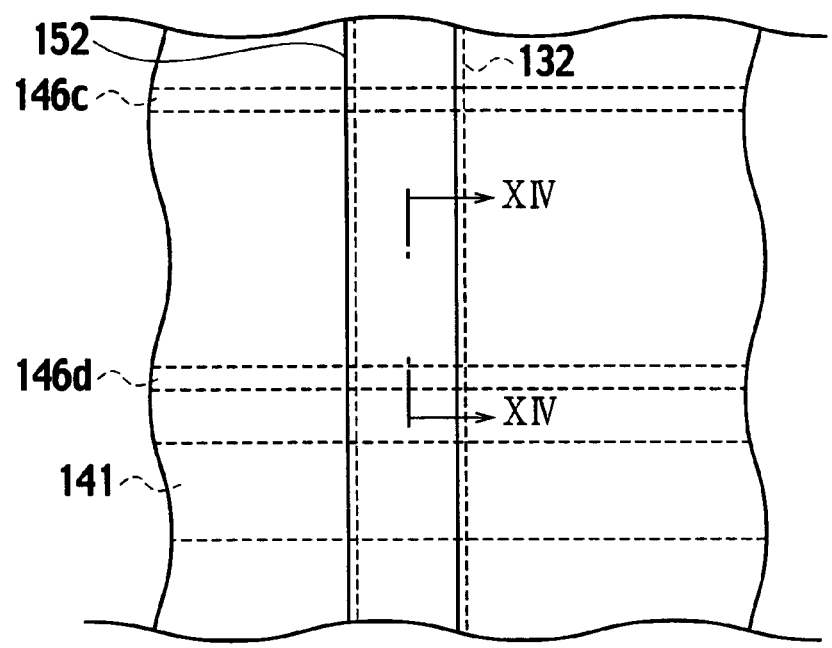
FIG. 13 is a plan view illustrating a comparative example of the semiconductor integrated circuit according to the first embodiment of the present invention.
Figure 14:
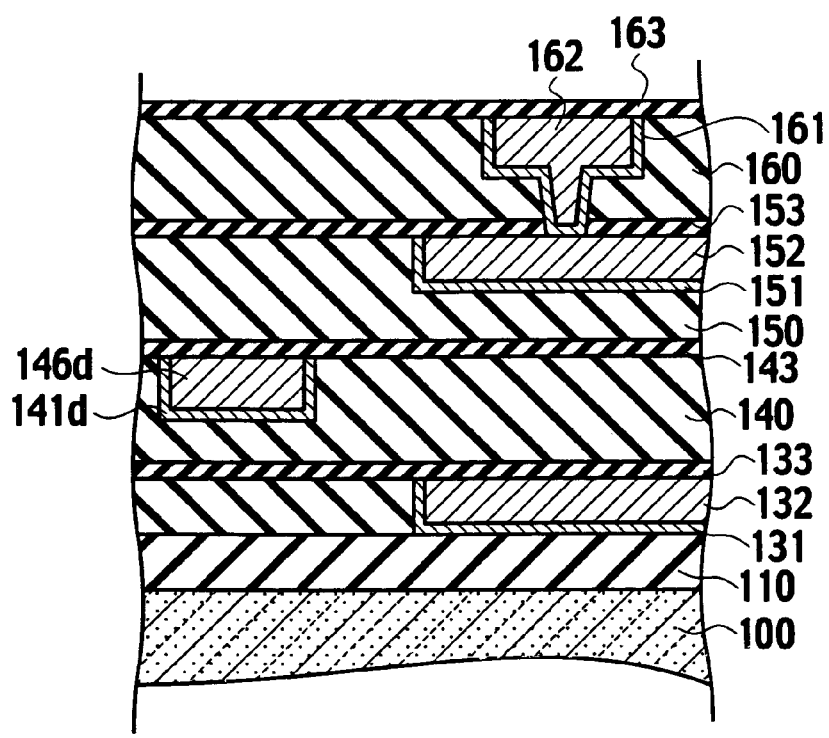
FIG. 14 is a cross-sectional view illustrating the comparative example of the semiconductor integrated circuit taken on line XVI-XVI in FIG. 13, according to the first embodiment of the present invention.

FIGS. 13 and 14 show comparative example of the semiconductor integrated circuit with no dummy line 145. As shown in FIG. 13, there is no rectangular dummy lines having a long axis extending in the drawing direction of the first and third power line 142 and 152 on the same interconnection layer as the second power line 141. As shown in FIG. 14, there are no metal lines between the first power line 132 and the third power line 152 in the third and fourth insulator dielectric 140 and 150. Therefore, the semiconductor integrated circuit in FIG. 13 may have cracks in the third and fourth insulator dielectrics 140 and 150 during the fabrication process of forming interconnects on the upper layer of the signal line 162.

On the other hand, as shown in FIGS. 9 to 12, the semiconductor integrated circuit has a metal layer, which is composed of the dummy line 145, the first dummy vias 1451 and 1452, and the second dummy vias 1551 and 1552, in the third and fourth insulator dielectrics 140 and 150. Therefore, cracks may not occur in the third and fourth insulator dielectrics 140 and 150 when multi-level interconnects are formed on the upper layer of the signal line 162 and semiconductor integrated circuit having strong mechanical strength can be formed. Since the dummy line 145 is connected to the first power line 132 and the third power line 152, the dummy line 145 works as a shield plane and prevents failure resulting from the crosstalk noise between adjoining signal lines.

In the semiconductor integrated circuit of FIGS. 9 to 12, the dummy line 145, the first and second dummy vias 1451, 1452, 1551, and 1552 have a rectangular shape or an oval shape, which has a long axis in the drawing direction of the first and third power lines 132 and 152. Therefore, the semiconductor integrated circuit according to the first embodiment has strong resistance to stress in the drawing direction of the first power line 132. Other power lines in addition to the first to third power lines 132, 141, and 152 are provided on each layer of the multi-level interconnections. Thus, it is easy to provide the semiconductor integrated circuit with strong mechanical strength by connecting the dummy lines to the each power lines.

Second Embodiment

Figure 15:
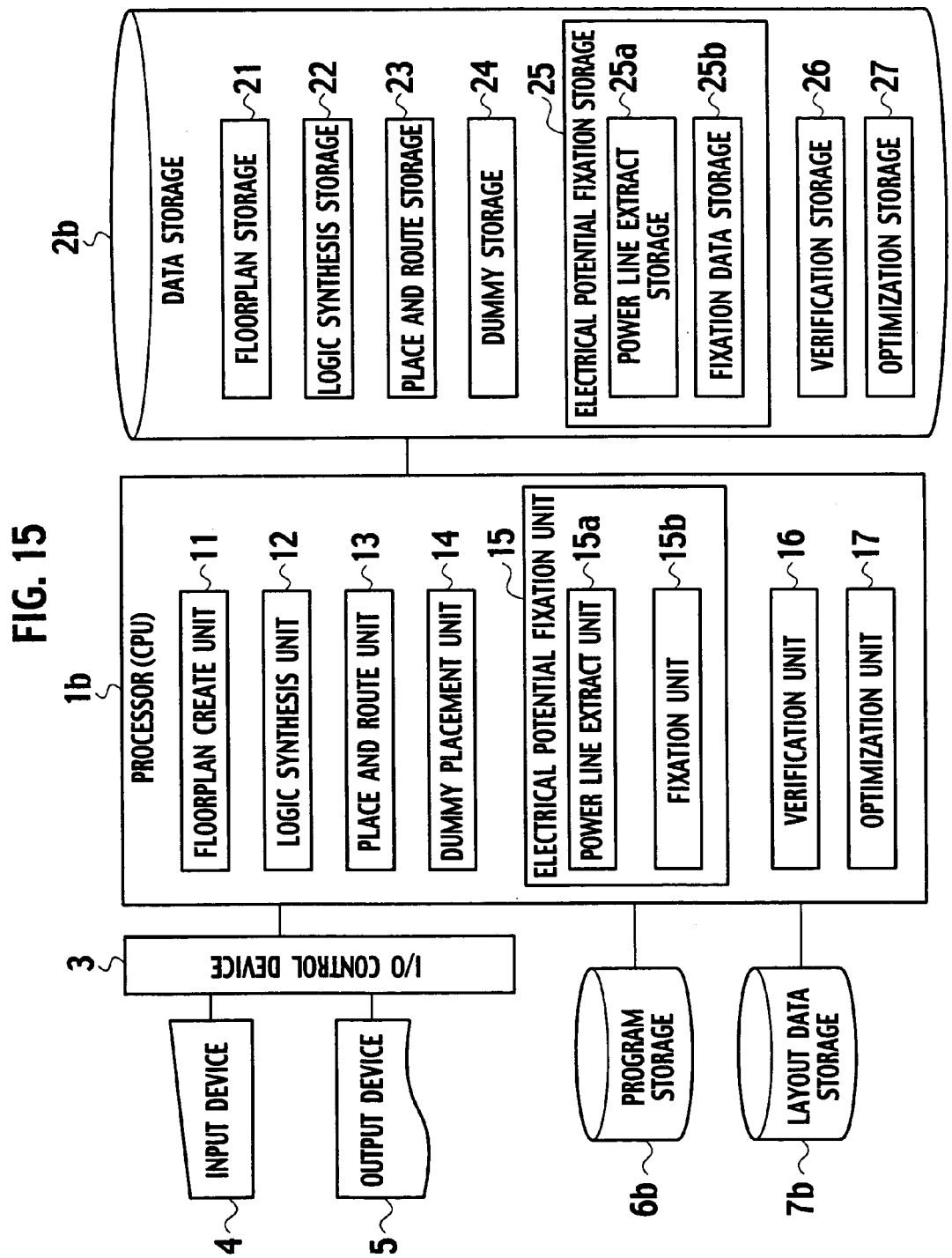
FIG. 15 is a block diagram illustrating an automated design system according to a second embodiment of the present invention.

As shown in FIG. 15, the automated design system according to the second embodiment of the present invention includes the input device 4, a processor (CPU) 1b, a data storage 2b, output device 5, a program storage 6b, and a layout data storage 7b. The input device 4 and the output device 5 are connected to the CPU 1b through the I/O control device 3. The CPU 1b includes the floorplan create unit 11, the logic synthesis unit 12, the place and route unit 13, the dummy placement unit 14, the electrical potential fixation unit 15, the verification unit 16, and an optimaization unit 17.

Figure 16:
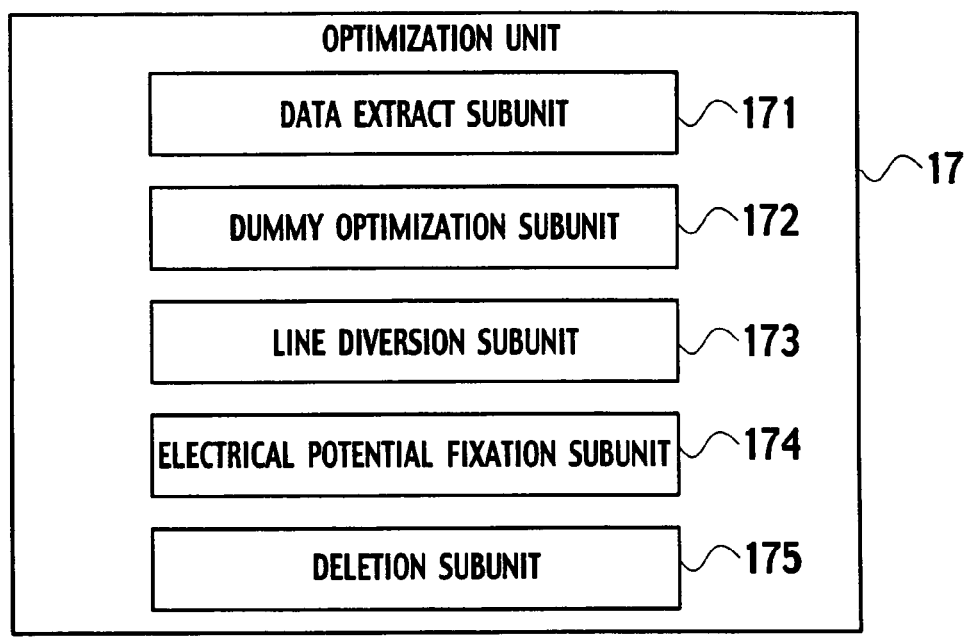
FIG. 16 is a block diagram illustrating an optimization unit of FIG. 15 according to the second embodiment of the present invention.

The optimization unit 17 extracts a dummy pattern, which is not positioned just above the power lines on a plane, to optimize the position of the dummy pattern to be placed just above the first power line and to change the size of the dummy pattern to enlarge a crossover area between the dummy pattern and the first power line, based on the result of the timing verification. The optimization unit 17 includes, as shown in FIG. 16, a data extract subunit 171, a dummy optimization subunit 172, a line diversion subunit 173, the electrical potential fixation subunit 174, and a deletion subunit 175.

Figure 17:
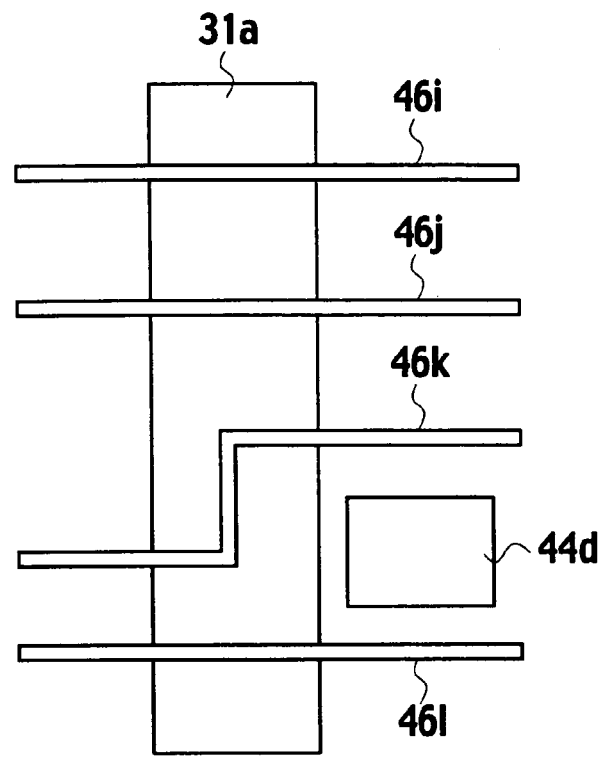
FIGS. 17 and 18 are plan views illustrating layout examples of layout examples designed by the automated design system according to the second embodiment of the present invention.
Figure 18:
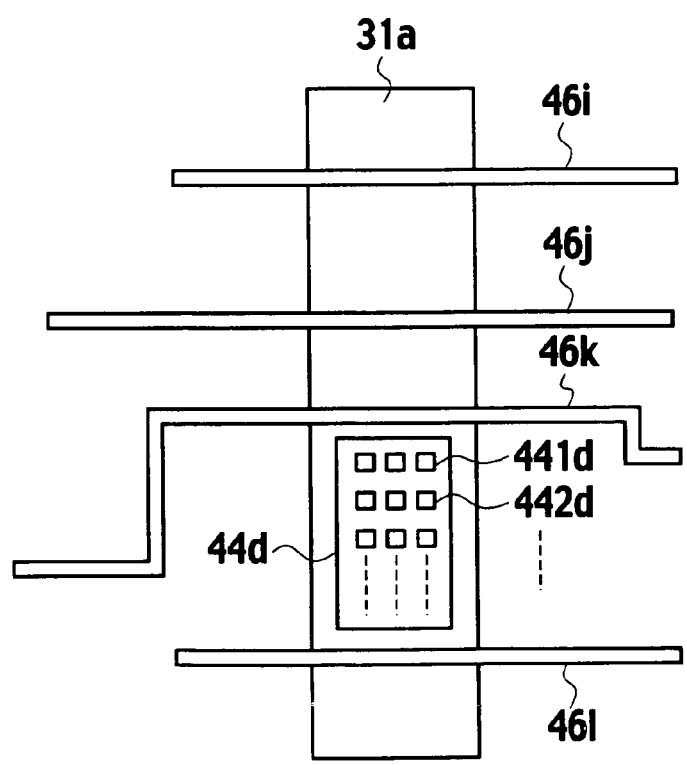

The data extract subunit 171 extracts placement data of multi-level interconnects and dummy patterns placed by the place and route unit 13 and the dummy placement unit 14. The dummy optimization subunit 172 extracts extracted data, such as a dummy pattern 44d adjoining the first high voltage power line 31a as shown in FIG. 17, and changes position of the dummy pattern 44d on the first high voltage power line 31a as shown in FIG. 18. The dummy optimization subunit 172 optimizes the shape of the dummy pattern 44d to have a long axis orienting in a drawing direction of the first high voltage power line 31a as shown in FIG. 18.

The dummy optimization subunit 172 can optimize the shapes of dummy patterns so that a plurality of minute dummy patterns, which are positioned away from just above the first high voltage power line 31a, may be conjoined to make the size of the dummy pattern as large as possible.

The line diversion subunit 173 read the result of the timing verification verified by the verification unit 16. The line diversion subunit 173 diverts divertible line patterns, having sufficient paths to be extended, to divert the divertible line pattern from the dummy pattern, based on the result of timing verification. The line diversion subunit 173 does not displace critical path lines.

For example, as shown in FIG. 17, signal lines 46i, 46j, 46k, and 46l are provided on the first high voltage power line 31a and extend perpendicular to the first high voltage power line 31a. When the signal line 46k is a divertible line pattern, and the signal lines 46i, 46j, and 46i are critical paths, the line diversion subunit 173 diverts the signal line 46k from the dummy pattern 44d.

The electrical potential fixation subunit 174 fixes optimized dummy pattern 44d to the first high voltage power line 31a with the dummy vias 441d, 442d, . . . so that the optimized dummy pattern 44d has the same electrical potential as the first line voltage power line 31a. The verification unit 16 verifies timing based on the optimized data of the dummy patterns. The deletion subunit 175 deletes optimized data as shown in FIGS. 17 and 18 when the timing verification does not meet the timing verification limitation parameters.

The data storage 2b includes the floorplan storage 21, the logic synthesis unit 22, the place and route storage 23, the dummy storage 24, the electrical potential fixation storage 25, the verification storage 26, and an optimization storage 27. The optimization storage 27 stores optimized data of the dummy pattern executed by the optimization unit 17. Other elements are substantially the same as the automated design system as shown in FIG. 1, and detailed explanation is omitted.

Figure 19:
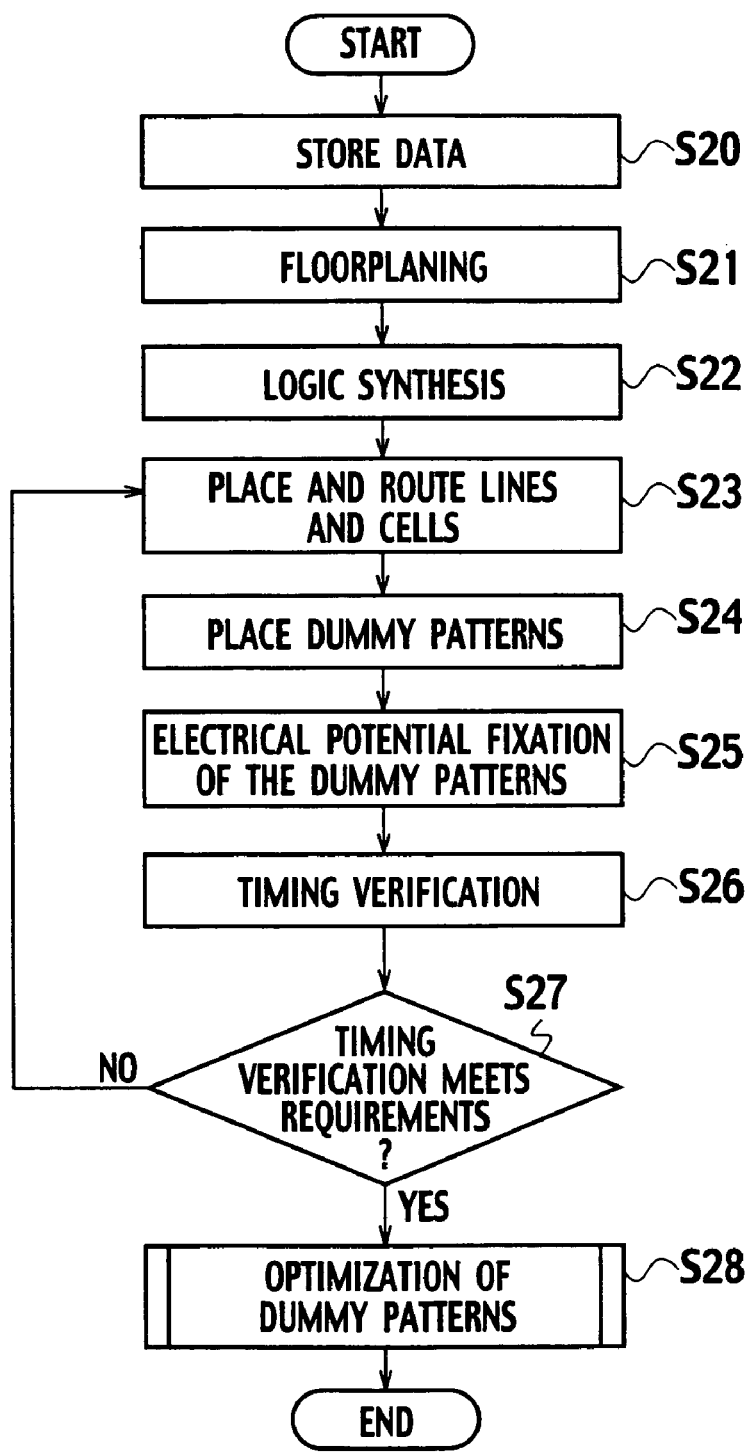
FIGS. 19 and 20 are flowcharts illustrating a method of designing a semiconductor integrated circuit according to the second embodiment of the present invention.

Next, a description will be given of a computer implemented method for designing a semiconductor integrated circuit according to the second embodiment with reference to the flowcharts of FIGS. 19 and 20. Since the method described in the steps S20 to S27 are substantially the same as the steps S10 to S17 as shown in FIG. 8, detailed explanations are omitted.

In a step S28, the optimization unit 17 reads placement data of the lines in the multi-level interconnections and dummy patterns from the place and route storage 23 and the dummy storage 24, and results of timing verification stored in the verification storage 26. The optimization unit 17 optimizes positions of the dummy patterns in the multi-level interconnections in steps S280 to S287 as shown in FIG. 20.

Figure 20:
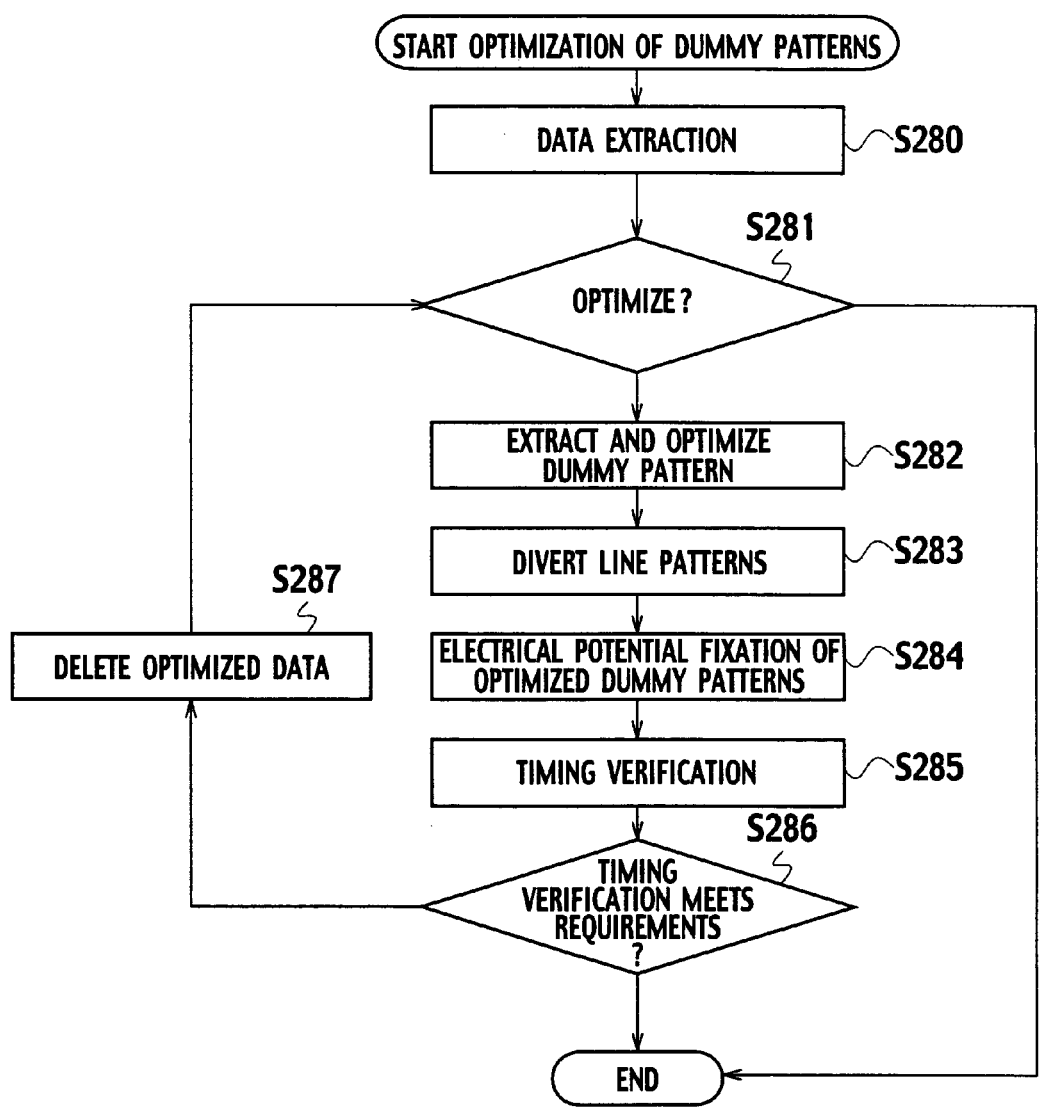

In a step S280 in FIG. 20, the data extract subunit 171 as shown in FIG. 16 extracts data required for the optimization treatment of the dummy pattern stored in the layout data storage 7b. The extract data is stored in the optimization storage 27. In a step S281, the data extract subunit 171 reads extracted data stored in the optimization storage 27 and the verification data stored in the verification storage 26. The optimization is executed appropriately and there is no need to optimize data, optimization is completed.

When the optimization is required, in a step S282, as shown in FIG. 17, the dummy optimization subunit 172 reads the optimization data and placement data of the dummy patterns and extracts the dummy pattern 44d. The dummy pattern 44d is not positioned just above the first high voltage power line 31a on the plane, adjoining the first high voltage power line 31a. As shown in FIG. 18, the dummy optimization subunit 172 optimizes the size of the dummy pattern 44d by enlarging the dummy pattern 44d so that the dummy pattern 44d and the first high voltage power line 31a can be overlapped with a larger area.

Further, the dummy optimization subunit 172 optimizes the shape of the dummy pattern 44d to have a long axis in the drawing direction of the first high voltage power line 31. The dummy pattern 44d may have a rectangular shape. When there is adjoining patterns around the dummy pattern 44, the dummy optimization subunit 172 can connect adjoining patterns with the dummy pattern 44d to enlarge the size of the dummy pattern 44d. Optimized data of the dummy pattern 44d is stored in the optimization storage 27.

In a step S283, the line diversion subunit 173 reads optimized data of the dummy pattern 44d and the result of timing verification stored in the verification storage 26. The line diversion subunit 173 extracts divertible line patterns, having sufficient paths to be extended, and diverts the divertible line patterns from the dummy pattern 44d. As shown in FIG. 17, the line diversion subunit 173 diverts the signal line 46k so that the dummy pattern 44d can be positioned on the first high voltage power line 31a. The data of the diverted signal line 46k is stored in the optimization storage 27.

In a step S284, the electrical potential fixation subunit 174 reads optimized data of the dummy pattern 44d and data of the interconnection layer stored in the place and route storage 23. As shown in FIG. 18, the electrical potential fixation subunit fixes the first high voltage power line 31a to the dummy pattern 44d by use of the dummy vias 441d, 442d, . . . to have the same electrical potential as the first high voltage power line 31a. The fixed data of the dummy pattern 44d and the dummy vias 441d, 442d are stored in the optimization unit 27.

In a step S285, the verification unit 16 reads the fixed data of the dummy pattern 44d and the dummy vias 441d, 442d, . . . and placement data stored in the place and route storage 23. The verification unit 16 verifies a circuit timing of the interconnection layers by STA based on the data stored in the timing verification data. Verified data is stored in the verification storage 26. In a step S286, the verification unit 16 reads layout data stored in the layout data storage 7b and verified data stored in the verification storage 26 and evaluates whether or not the verified data meets the timing limitation parameter stored in the layout data storage 7b. When verified data meets the timing limitation parameter, the optimization process is completed. When verified data does not satisfy the timing limitation parameter, the process goes to a step S287. In a step S287, the deletion subunit 175 reads data of the dummy pattern 44d and the dummy vias 441d, 442d, . . . stored in the optimization storage 27. The deletion subunit 175 deletes the processes of steps S281-286. The process goes to the step S281.

The computer implemented method for designing the semiconductor device according to the second embodiment of the present invention optimizes the size and shape of the dummy pattern after the dummy pattern is placed in the interconnection layers. Therefore, the dummy patterns are connected to the power lines in the interconnection layers. Since the power lines and the dummy patterns and the dummy vias provided between the power lines and the dummy patterns serves as a metallic wall in the multi-level interconnections, a semiconductor integrated circuit with strong mechanical strength can be formed. In addition, since the line diversion subunit 173 diverts divertible line patterns having sufficient path and timing to be extended, mechanical strength of the interconnection layers will be increased. The power lines provided in each interconnection layers, the dummy patterns connected to the power lines can be inserted in every layer in the semiconductor integrated circuit. As shown in FIG. 18, since the electrical potential fixation subunit 174 fixes the dummy pattern 44d to the first high voltage power line 31a to have the same electrical potential as the first high voltage power line 31a, crosstalk noise between adjoining signal lines may be shielded.

Other Embodiments

Various modifications will become possible for those skilled in the art after receiving the teachings of the present disclosure without departing from the scope thereof.

Figure 21A:
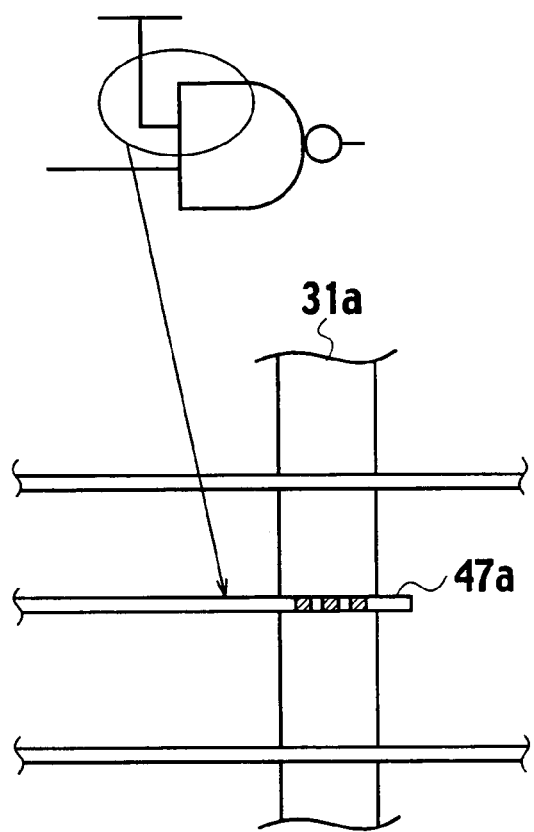
FIGS. 21A and 21B are plan views illustrating layout examples designed by the automated design system according to the other embodiment of the present invention.
Figure 21B:
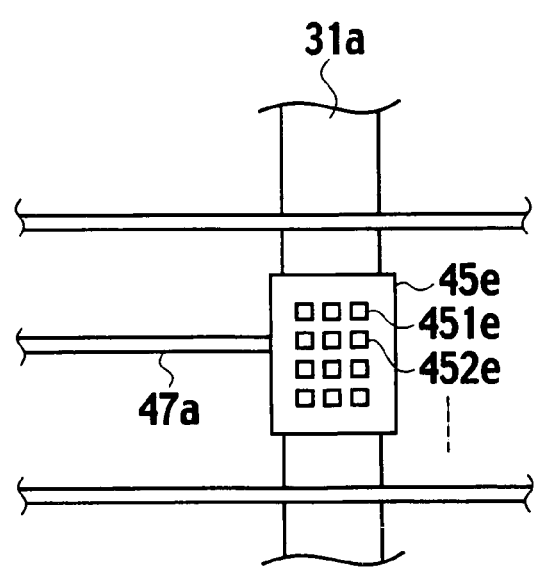

In the first and second embodiment, the dummy placement unit 14 places the dummy patterns 45a, 45b, 45c, and 45d in the interconnection layers. However, as shown in FIG. 21A, the dummy placement unit 14 can extract line pattern 47a, which is previously placed in the layer and connected to a transistor or the substrate, and route the line pattern 47a and the first high voltage power line 31a with a plurality of vias 451e, 452e, . . . , as shown in FIG. 21B.

What is claimed is:

1. A computer implemented method for designing a semiconductor integrated circuit comprising:
    placing a first power line on a first interconnection layer;
    placing a dummy pattern on a second interconnection layer positioned just above the first power line based on a placement result of the first power line, the dummy pattern having a long axis parallel with a direction of the first power line; and
    electrically connecting the dummy pattern to the first power line, based on placement results of the first power line and the dummy pattern.

2. The computer implemented method of claim 1, wherein the dummy pattern and the first power line are connected by a plurality of dummy vias having a long axis in the direction of the first power line.

3. The computer implemented method of claim 1, further comprising:
    placing a second power line on a third interconnection layer positioned just above the dummy pattern, the second power line extending in a same direction as the first power line; and
    electrically connecting the dummy pattern to the second power line.

4. The computer implemented method of claim 1, further comprising:
    placing a plurality of signal lines on the second interconnection layer, each of the signal lines having a line width smaller than the first power line,
    wherein a number of the signal lines positioned just above the first power line is limited by placement limitation data.

5. The computer implemented method of claim 4, further comprising:
    verifying a timing of a circuit based on placement result of the first power line, the dummy pattern and the signal lines; and
    diverting the signal lines from an upper layer of the first power line based on a result of timing verification.

6. The computer implemented method of claim 5, further comprising:
    optimizing a position of the dummy pattern to be placed just above the first power line based on the result of the timing verification;
    optimizing a size of the dummy pattern to enlarge a crossover area between the dummy pattern and the first power line on a plane based on the result of the timing verification; and
    storing optimized data of the dummy pattern in an optimization storage.

7. The computer implemented method of claim 6, further comprising:
    verifying optimized data of the dummy pattern and storing a verification result of the optimized data in a verification storage; and
    deleting the optimized data of the dummy pattern in the optimization storage based on the verification result of the optimized data.

8. The computer implemented method of claim 1, wherein the dummy pattern is placed just above the first power line with priority to a plurality of signal lines provided on the second interconnection layer, based on placement limitation data.

9. A semiconductor integrated circuit comprising:
    a semiconductor substrate;
    a first power line provided on the semiconductor substrate;
    a first insulator dielectric having a relative dielectric constant equal to or lower than silicon oxide provided on the first power line;
    a dummy line embedded in the first insulator dielectric and extending parallel to a direction of the first power line; and
    a plurality of first dummy vias embedded in the first insulator dielectric and connected to the first power line and the dummy line.

10. The semiconductor integrated circuit of claim 9, wherein each of the first dummy vias has a long axis parallel to the direction of the first power line.

11. The semiconductor integrated circuit of claim 9, further comprising a diffusion barrier film having a higher relative dielectric constant than the dielectric constant of the first insulator dielectric, and provided on the first insulator dielectric.

12. The semiconductor integrated circuit of claim 9, wherein the first insulator dielectric is composed of a plurality of films having different relative dielectric constants respectively.

13. The semiconductor integrated circuit of claim 9, further comprising:
    a second insulator dielectric having a relative dielectric constant equal to or less than silicon oxide provided on the dummy line;
    a second power line embedded in the second insulator dielectric and extending in a same direction as the direction of the first power line;
    a plurality of second dummy vias embedded in the second insulator dielectric and connected to the second power line and the dummy line.

14. A semiconductor integrated circuit having multi-level interconnects, comprising:
    a plurality of first power lines provided on a semiconductor substrate;
    a first insulator dielectric having a relative dielectric constant equal to or lower than silicon oxide provided on the first power lines; and
    a plurality of dummy lines embedded in the first insulator dielectric above one of the first power lines, in an area corresponding to a planar area where a density of signal lines in the multi-level interconnects is low, each of the dummy lines having a long axis parallel to a direction of the first power lines.

15. The semiconductor integrated circuit of claim 14, further comprising a plurality of first dummy vias connected to the first power lines and the dummy lines,
    wherein each of the first dummy vias has a long axis parallel to the direction of the first power lines.

16. The semiconductor integrated circuit of claim 15, further comprising:
  a second insulator dielectric having a relative dielectric constant equal to or lower than silicon oxide provided on the dummy lines;
  a plurality of second power lines embedded in the second insulator dielectric, positioned just above the dummy lines and extending in a same direction as the direction of the first power lines; and
  a plurality of second dummy vias embedded in the second insulator dielectric and connected to one of the second power lines and the dummy lines.

17. The semiconductor integrated circuit of claim 14, further comprising a plurality of diffusion barrier films provided on the first insulator dielectric and the first power lines.

* * * * *